United States Patent
Jeong et al.

(10) Patent No.: US 7,645,133 B2
(45) Date of Patent: Jan. 12, 2010

(54) UV NANOIMPRINT LITHOGRAPHY PROCESS AND APPARATUS

(75) Inventors: Jun-Ho Jeong, Daejeon (KR); HyonKee Sohn, Daejeon (KR); Young-Suk Sim, Seoul (KR); Young-Jae Shin, Daejeon (KR); Eung-Sug Lee, Daejeon (KR); Kyung-Hyun Whang, Daejeon (KR)

(73) Assignee: Korea Institute of Machinery & Materials, Daejeon (KR)

( * ) Notice: Subject to any disclaimer, the term of this patent is extended or adjusted under 35 U.S.C. 154(b) by 805 days.

(21) Appl. No.: 11/063,532

(22) Filed: Feb. 24, 2005

(65) Prior Publication Data

US 2005/0184436 A1 Aug. 25, 2005

(30) Foreign Application Priority Data

Feb. 24, 2004 (KR) ...................... 10-2004-0012191

(51) Int. Cl.
*B29C 59/00* (2006.01)
(52) U.S. Cl. ................. 425/385; 425/174.4; 425/387.1; 425/405.1
(58) Field of Classification Search ................. 425/385, 425/387.1, 174.4, 405.1; 264/293
See application file for complete search history.

(56) References Cited

U.S. PATENT DOCUMENTS

| | | | | |
|---|---|---|---|---|
| 5,558,015 A | * | 9/1996 | Miyashita et al. | 100/50 |
| 2003/0159608 A1 | * | 8/2003 | Heidari | 101/494 |
| 2003/0189273 A1 | * | 10/2003 | Olsson | 264/293 |
| 2004/0009673 A1 | * | 1/2004 | Sreenivasan et al. | 438/694 |
| 2004/0036850 A1 | * | 2/2004 | Tsukamoto et al. | 355/72 |
| 2005/0146078 A1 | * | 7/2005 | Chou et al. | 264/293 |

\* cited by examiner

*Primary Examiner*—Maria Veronica D Ewald
(74) *Attorney, Agent, or Firm*—Pearl Cohen Zedek Latzer, LLP (57) ABSTRACT

A UV nanoimprint lithography process and its apparatus that are able to repeatedly fabricates nanostructures on a substrate (wafer, UV-transparent plate) by using a stamp that is as large as or smaller than the substrate in size are provided. The apparatus includes a substrate chuck for mounting the substrate; a stamp made of UV-transparent materials and having more than two element stamps, wherein nanostructures are formed on the surface of each element stamp; a stamp chuck for mounting the stamp; a UV lamp unit for providing UV light to cure resist applied between the element stamps and the substrate; a moving unit for moving the substrate chuck or the stamp chuck to press the resist with the element stamps and substrate; and a pressure supply unit for applying pressurized gas to some selected regions of the substrate to help complete some incompletely filled element stamps.

9 Claims, 6 Drawing Sheets

UV NANOIMPRINT LITHOGRAPHY PROCESS AND APPARATUS

CROSS REFERENCE TO RELATED APPLICATION

This application claims priority to and the benefit of Korean Patent Application No. 10-2004-0012191, filed on Feb. 24, 2004, which is hereby incorporated by reference for all purposes as if fully set forth herein

BACKGROUND OF THE INVENTION (a) Field of the Invention

The present invention relates to a UV nanoimprint lithography process and its apparatus, and more specifically, to a UV nanoimprint lithography process and its apparatus capable of repeatedly fabricating nanostructures on a substrate (e.g. wafer, glass, quartz, etc.) with a stamp having the nanostructures engraved thereon.

(b) Description of Related Art

The UV nanoimprint lithography technology is an economical and effective method of fabricating nanostructures It is multidisciplinary, so that it should be supported by various technologies from such fields as nano-scale materials science, stamp fabrication, ant-adhesion layer, etching and measurements. The nano-scale precision control technology is regarded as a basis.

The UV nanoimprint lithography technology is applicable to ultra high-speed metal-oxide-semiconductor field-effect transistors (MOSFETs), metal-semiconductor field-effect transistors (MESFETs), high-density magnetic storage devices, high-density compact disks (CD), nano-scale metal-semiconductor-metal photodetectors (MSM PDs), and high-speed single-electron transistor memory, etc.

In the nanoimprint process, developed by Prof. Chou et al. at Princeton Univ. in 1996, a stamp having embossed structures fabricated by the electron beam lithography process is pressed at high temperature on the wafer coated with a polymethylmethacrylate (PMMA) resist, and is released when the resist is cooled. Thus, the resist is imprinted with the negative patterns of nanostructures of the stamp, and an anisotropic etching process is followed to open the etch window of the wafer. In 2001, a laser-assisted direct imprint (LADI) method, that uses a single 20-ns Excimer laser with a wavelength of 308-nm to instantaneously melt the surface of a silicon wafer or the resist coated on a silicon wafer. Similarly, in a nanosecond laser-assisted nanoimprint lithography (LA-NIL) applied to polymer, nanostructures with a line width of 100 nm and a depth of 90 nm are imprinted to polymer-based resist.

The aforementioned nanoimprint technologies are performed at high temperature. This makes them inapplicable to the implementation of semiconductor devices, a multi-layer process, because thermal deformation occurring in these technologies will hinder multi-layer alignment. Furthermore, high pressure (about 30 atmospheric pressures) required to imprint high-viscosity resist can break or damage previously fabricated nanostructures. Opaque stamps used in these processes are also an obstacle to the multi-layer alignment.

To address these problems, the step & flash imprint lithography (SFIL) process is suggested by Prof. Sreenivasan at the University of Texas at Austin in 1999. This process uses a UV-curable material to fabricate a nanostructure at low pressure and room temperature. is characterized by the fact that UV-transparent materials such as quartz and Pyrex® glass are used for the stamp In the SFIL process, a transfer layer is first spin-coated on a silicon wafer, and a low-viscosity UV-curable resin is filled into the nanostructures while maintaining a certain interval between the UV-transparent stamp and the transfer layer.

Subsequently, at the time of completion of the filling, the stamp is in contact with the transfer layer and the resin is cured by illuminating with UV light. Thereafter, the stamp is separated and the nanostructure is transferred on the wafer by the etching and the lift-off processes.

However, the gap distribution between the stamp and the wafer for use in the UV nanoimprint lithography process is not constant (e.g., Si wafer: 20~30 μm), so that the resist may be insufficiently pressed by the stamp during imprinting. In the SFIL process using a small-area stamp, the distance between the stamp and the wafer is measured with distance sensors attached at the sides of the stamp before pressing the stamp is used, and, based on the measurements, the stamp is finely rotated to the stamp as parallel as possible to the wafer. In other words, in SFIL, imprinting is performed in such a way that the stamp with nanostructures is manipulated according to the waveness of the wafer surface The SFIL process is also characterized by the fact that the entire wafer is imprinted not at one time but repeatedly in several times because it uses a small-area stamp, smaller than the wafer in size. This is a sort of the step-and-repeat type imprinting. Since it uses a small-area stamp and the alignment and imprinting should be repeated, it will take a long time to finish imprinting of a large-area wafer.

Further, to imprint a large-area wafer in a short time, a large-area stamp on which nanostructures are fabricated can be used to press the resist deposited on the wafer. However, the larger the stamp and the wafer become, the more serious the error of flatness becomes. This means that some of the resist may be insufficiently pressed and some of the nano structures may be incompletely filled, In addition, the non-uniform residual layer thickness, which occurs because of the error of flatness, can make the etching process difficult or unsuccessful

SUMMARY OF THE INVENTION

The present invention provides a UV nanoimprint lithography process and its apparatus capable of efficiently forming high-precision, high-quality nanostructures irrespective of the error of flatness thereof.

The present invention also provides a UV nanoimprint lithography process and its apparatus capable of yielding a large-area stamp at low cost.

According to an exemplary embodiment of the present invention, there is provided a method of performing a UV (ultraviolet) nanoimprint lithography process for forming nanostructures on a substrate. The method may include preparing a stamp having more than two element stamps. The nanostructures may be formed on the surface of each element stamp. Resist may be applied to the surface of a substrate or on the element stamps. The stamp and the substrate may be mounted on a stamp chuck and a substrate chuck, respectively. In some embodiments the substrate chuck or the stamp chuck may be moved to press the resist on the surface of a substrate or on the element stamps. Pressurized gas may be applyied to some selected regions of the substrate to help complete some incompletely filled element stamps Pressed resists may be cured by illuminating the resists with UV light to cure the resist. The stamp may be separated from the substrate. A relative position between the substrate and the stamp may be changed to continue imprinting another predetermined region of the substrate. By repeating the above steps, nanostructures may be formed all over the surface of substrate.

Here, a wafer or stamp materials (UV-transparent materials) may be used for the substrate.

In addition, applying the resist may be performed by one of the following methods: including but not limited to a spin coating method which applies the resist to all over the surface of the substrate, a droplet dispensing method which directly deposits resist droplets to the surface of each element stamp, and a spraying method which arranges a mask having an opening corresponding to the positions of the respective element stamp and sprays the resist thereon, thereby applying the resist to some portion of region over the substrate.

For the droplet dispensing method or the spraying method, after separating the stamp from the substrate, the resist may be applied to the surface of the element stamp for the second process.

when the resist is imprinted on the predetermined region of the substrate, nanostructures may be transferred to the substrate by etching the upper surface of the substrate having the deposited resist.

According to another exemplary embodiment of the present invention, a UV nanoimprint lithography apparatus for forming nanostructures on a substrate may be included. The UV nanoimprint lighography may include a substrate chuck for mounting a substrate; a stamp made of a transparent material transmitting UV light and having more than two element stamps, wherein nanostructures are formed on a surface of each element stamp; a stamp chuck for mounting the stamp; a UV lamp unit for providing UV light to cure resist applied between the element stamps and the substrate; a moving unit for moving the substrate chuck or the stamp chuck to press the resist on the surface of substrate or on the element stamps; and a pressure supply unit for applying pressurized gas to some selected regions of the substrate to help complete some incompletely filled element stamps.

In addition, the substrate chuck may be arranged to move in the horizontal direction along the guide block and to move in the vertical direction by the moving unit.

In some embodiments, the substrate chuck may be guided by a plurality of guide rods while moving in the vertical direction using the moving unit.

The moving unit may be arranged to move the pressure supply unit in the vertical direction may include a hydraulic cylinder or a motor-driven actuator.

In an embodiment, the pressure supply unit may include: a closure type of housing having a hollow cavity. In addition, a plurality of gas supply holes may be provided in the housing and connected to the hollow cavity. Some embodiments may also include a gas supplier for supplying pressurized gas to the hollow cavity and through holes connected to the plurality of gas supply holes and provided in the substrate chuck.

Furthermore, a sealing member (e.g. an O-ring) may be mounted on the upper surface of the housing to prevent leakage of the pressurized gas supplied to the through-holes via the plurality of gas supply holes.

In addition, the apparatus may further include a gas supply nozzle for spraying gas between the stamp and the substrate to separate the stamp from the substrate when the imprinting is finished.

Furthermore, the stamp may be an elementwise patterned stamp. The element-wise patterned stamp may include at least two element stamps on which nanostructures are engraved. In addition, the element-wise patterned stamp may include a plurality of channels being deeper than the nanostructures between adjacent element stamps, or a well-known planar-type stamp.

According to an embodiment, a resist insufficiently pressed due to the error of flatness between a stamp and a substrate during imprinting can be further pressed by applying pressurized gas. Therefore, the insufficient filling of the resist, which may be generated when the nanostructures are fabricated on a large-area substrate (e.g. 8 inch wafer) in a single-step or step-and-repeat imprinting by using a large-area stamp (e.g. 5 in.×5 in. stamp), can be prevented. Accordingly, it is possible to economically and efficiently form high-precision and high-quality nanostructures in a short time.

Moreover, it is also possible to fabricate the stamp having the same working area with a substrate by using the aforementioned apparatus.

BRIEF DESCRIPTION OF THE DRAWINGS

The above and other features and advantages of the present invention will become more apparent by describing in detail exemplary embodiments thereof with reference to the attached drawings.

DETAILED DESCRIPTION

Now, embodiments of the present invention will be described with reference to the attached drawings.

Figure 1:
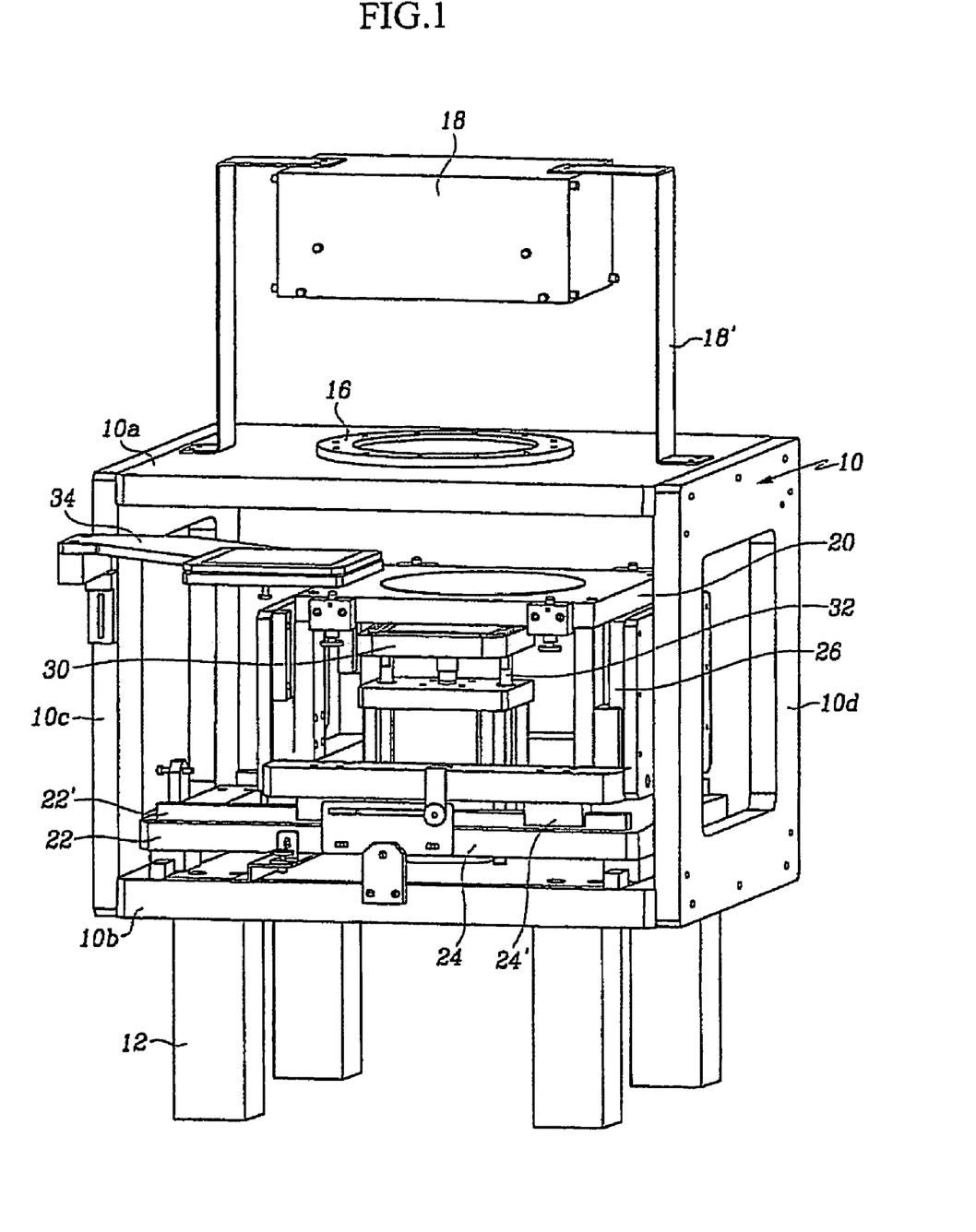
FIG. 1 is a schematic perspective view showing a a UV nanoimprint lithography apparatus according to an embodiment of the present invention.
Figure 2:
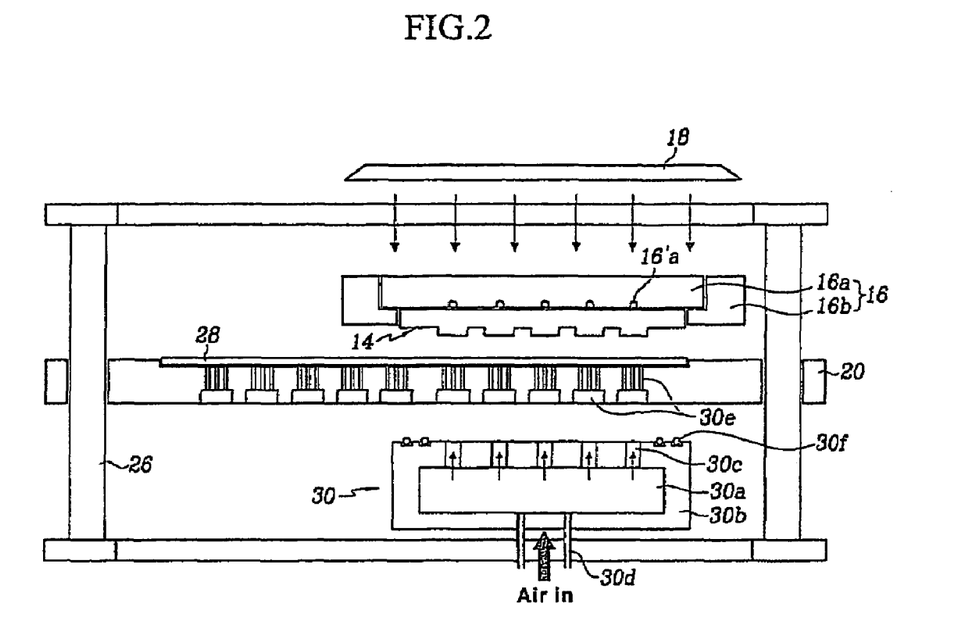
FIG. 2 is a side view for the UV nanoimprint lithography apparatus of FIG. 1.

FIG. 1 is a schematic perspective view showing a UV nanoimprint lithography apparatus according to an embodiment of the present invention, and FIG. 2 is a side view for the UV nanoimprint lithography apparatus of FIG. 1.

FIG. 1 depicts the apparatus including a base 10 having upper and lower frames 10a and 10b and left and right frames 10c and 10d. The base 10 is supported by four supporting corners 12 arranged on the lower plate 10b.

As shown in FIG. 2, a stamp chuck 16 mounting an element-wise patterned stamp 14 is fixedly arranged on the upper frame 10a. The stamp chuck 16 is made of a UV-transparent material and includes a back plate 16a for vacuum absorption of the element-wise patterned stamp 14 and the main body 16b mounting the back plate 16a, as shown in FIG. 2.

Although not shown in detail, the back plate 16a includes a vacuum line 16'a for vacuum absorption of the element-wise patterned stamp 14. The vacuum line 16'a is connected to a vacuum generator (not shown).

In addition, UV lamp unit 18 transmitting the element-wise patterned stamp 14 mounted on the stamp chuck 16 and illuminating the resist with UV light is arranged over the upper frame 10a at a certain height through two supporting bodies 18'. The resist may be pressed by a substrate.

In addition, FIG. 1 shows a guide block 22 guiding horizontal movement of a substrate chuck 20 (e.g., the wafer or the stamp board) arranged on the lower frame 10b. A slide block 24' of the chuck mounting plate 24 is coupled to a guide rail 22' of the guide block 22. A plurality of guide rods 26 guiding vertical movement of the substrate chuck 20 as well as supporting the substrate chuck 20 are arranged on the chuck mounting plate 24.

As illustrated in FIG. 2, a pressure supply unit 30 supplying pressurized gas to a substrate 28 mounted on the substrate chuck 20 may be positioned below the substrate chuck 20. The pressure supply unit 30 includes a closure type of housing 30b having a hollow cavity 30a, a plurality of gas supply holes 30c provided in the housing 30b and connected to the hollow cavity 30a, a gas supplier (not shown) for supplying gas to the hollow cavity 30a through a gas supply tube 30d, and a plurality of through holes 30e connected to the plurality of gas supply holes 30c and provided in the substrate chuck 20. In addition, a plurality of O-rings 30f are arranged on the housing 32b closely contacted to the lower surface of the substrate chuck 20 to prevent leakage of the gas discharged from the gas holes 30c.

The pressure supply unit 30 with the afore-mentioned construction may be arranged such that the housing 30b can move upward and downward by a moving unit 32. The moving unit 32 provides a force to move the substrate chuck 20 upward toward the element-wise patterned stamp 14. The moving unit 32 may include a hydraulic cylinder or a motor-driven actuator.

Further, a stamp mounting jig 34 mounting the element-wise patterned stamp 14 on the stamp chuck 16 is arranged on the left frame 10c. The stamp mounting jig 34 is interposed between the stamp chuck 16 and the substrate chuck 20. In addition, a gas spray nozzle (not shown) for intermittently spraying gas (e.g., air or nitrogen) between the substrate 28 and the element-wise patterned stamp 14 may be included to facilitate separation between the substrate 28 and the element-wise patterned stamp 14.

Figure 3:
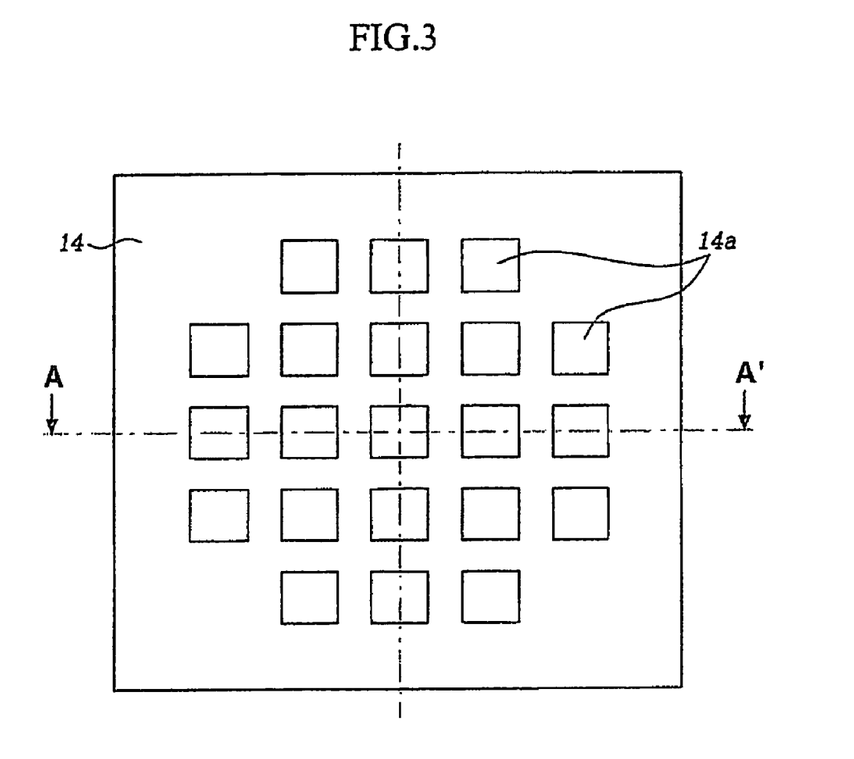
FIG. 3 is a plan view of an element-wise patterned stamp according to an embodiment of the present invention.
Figure 4:
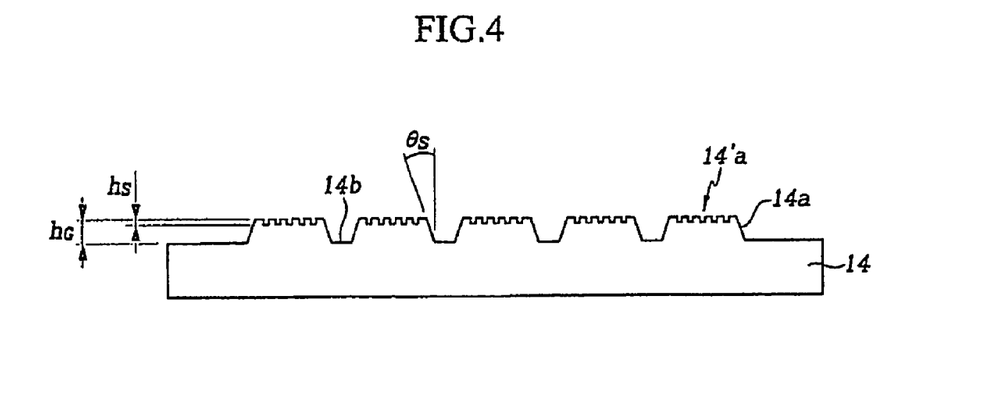
FIG. 4 is a cross sectional view taken along a line A-A' of FIG. 3.

FIG. 3 is a plan view of an element-wise patterned stamp according to an embodiment of the present invention, and FIG. 4 is a cross sectional view taken along a line A-A' of FIG. 3.

As shown in FIGS. 3 and 4, the element-wise patterned stamp 14 has a plurality of element stamps 14a arranged like a matrix according to an embodiment of the present invention. A plurality of channels 14b are provided between the adjacent element stamps. In addition, a plurality of nanoimprints 14'a imprinted by a nanofabrication process such as electron-beam lithography are formed on the respective element stamps 14a.

Here, the depth $h_G$ of the channel 14b may be in a range from about 2 times to 1000 times as large as the depth $h_S$ of the nanostructure 14'a. When the depth $h_G$ of the channel 14b is formed less than twice of the depth $h_S$ of the nanostructures 14'a, the resist flowed into the channel 14b cannot be sufficiently accepted due to the little difference between the depth $h_G$ of the channel 14b and the depth $h_S$ of the nanostructures 14'a. Otherwise, when the depth $h_G$ of the channel 14b is 1000 times as large as the depth $h_S$ of the nanostructures 14'a, the strength of the stamp 14 is reduced, so that the stamp 13 may be damaged during the nanoimprint process.

Now, a method of performing a UV nanoimprint lithography process using the afore-mentioned apparatus will be described with reference to FIGS. 1, 4, 5A through 5D.

Figure 5A:
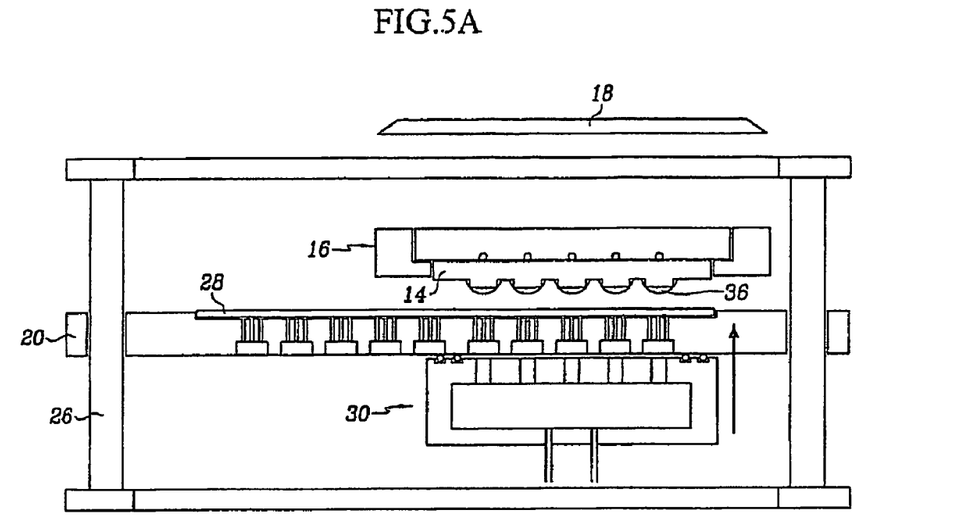
FIGS. 5A to 5D are diagrams showing a sequence of the UV nanoimprint lithography process according to an embodiment of the present invention.

First, to fabricate the nanostructures on the substrate 28 (e.g., the wafer) resist droplets 36 are applied on the surface of the nanostructures 14'a formed in the element stamps of the element-wise patterned stamp 14. Here, instead of applying the resist droplet on the surface of the nanostructures 14'a of the element stamps 14a, a spin-coating or spraying method may be used to apply the resist droplets to some or all regions of the wafer. In addition, it is desirable that the resist be made of a UV curing polymer.

Like this, the element-wise patterned stamp 14 having the deposited resist droplets 36 is mounted on the stamp chuck 16 by using the stamp mounting jig 34. The wafer is mounted on the substrate chuck 20. Here, the element-wise patterned stamp 14 is fixedly mounted on the stamp chuck 16 by using a vacuum pressure generated by the vacuum generator.

Figure 5B:
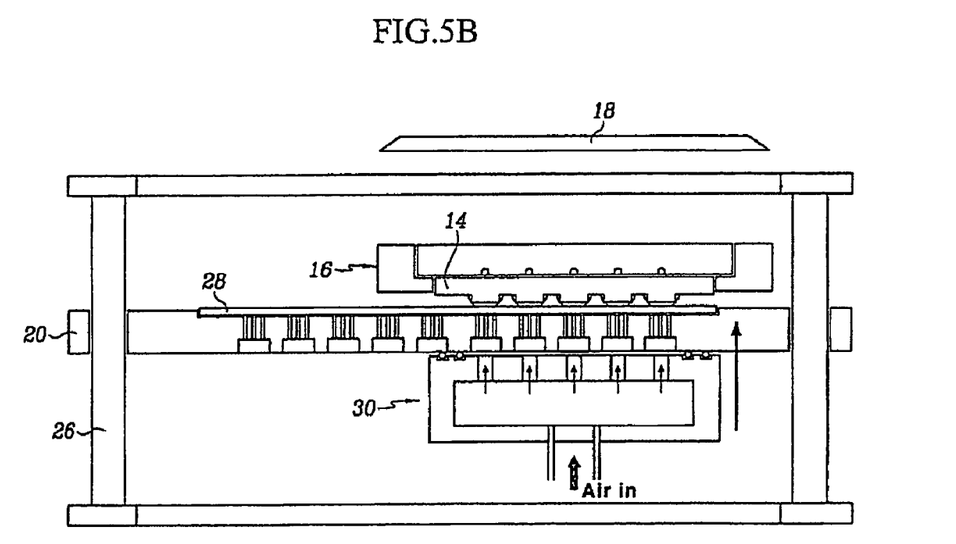

Next, the moving unit 32 (e.g., the hydraulic cylinder or the motor-driven actuator) operates to move the housing 30b of the pressure supply unit 30 vertically upward. When the housing 30b is moved upward, the O-rings 30f arranged on the surface of the housing 30b are closely adhered to the lower surface of the substrate chuck 20.

During this state, when the moving unit 32 keeps operating, the substrate chuck 20 moves upward along with the housing 30b. The moving unit 32 may move until the surface of the wafer mounted on the substrate chuck 20 presses the resist droplets 36 deposited on the surface of the nanostructures 14'a of the element-wise patterned stamp 14.

If the surface of the wafer presses the resist droplet by driving the moving unit 32, then the gas supplier of the pressure supply unit 30 will be driven. In addition, the gas supplied from the gas supplier passes through the gas supply tube 30d the hollow cavity 30a, the gas supply holes 30c, and the through holes 30e one after another and is selectively supplied to some region of the bottom surface of the wafer. Therefore, some regions of the wafer, preferably, regions facing the element stamps 14a, are pressed toward the respective element stamps 14a due to the gas pressure, so that the insufficient filling of the resist into the channels of the nanostructures due to the error of flatness between the element-wise patterned stamps and the wafer can be prevented.

During the gas supply process, the O-rings 30f prevent gas leakage

Figure 5C:
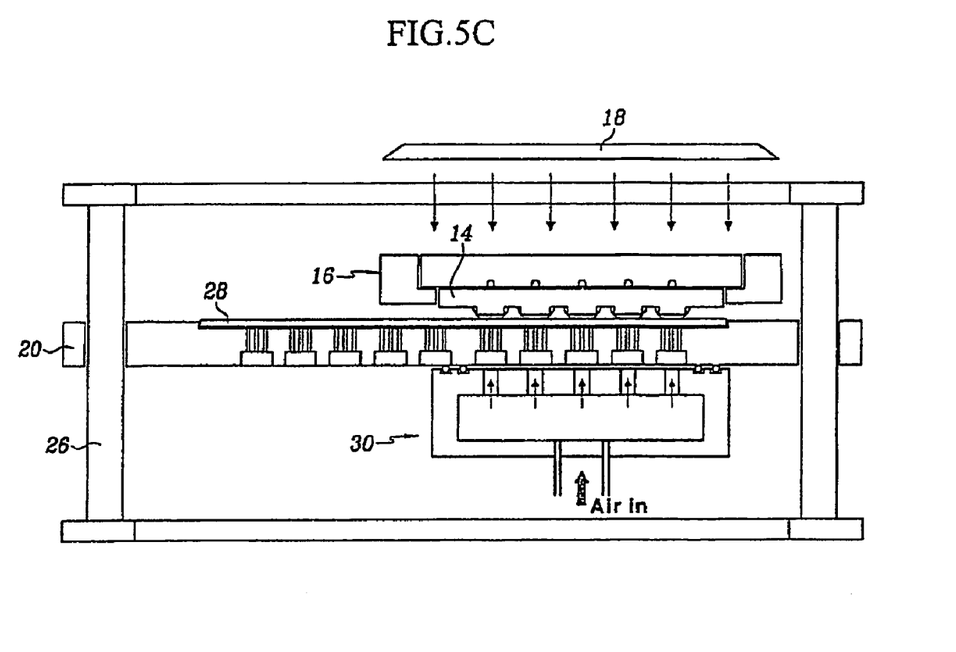

Next, the resist 36 is cured by illuminating resist 36 with UV light from the UV lamp unit 18.

Figure 5D:
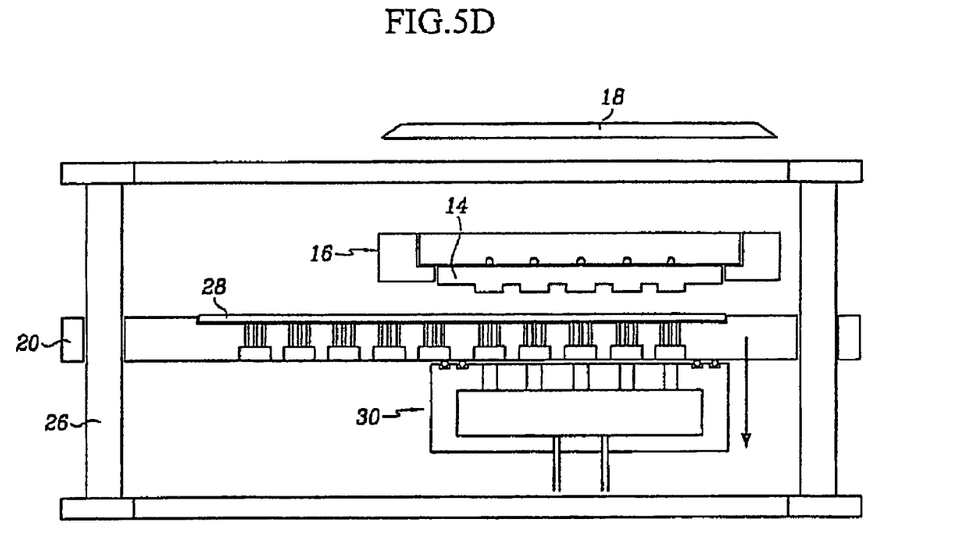

When the resist 36 is cured, the element-wise patterned stamp 14 is separated from the wafer. Due to the channels 14b of the element-wise patterned stamp 14, the separation between the element-wise patterned stamp 14 and the remaining cured resist over the wafer surface can be easily made. The gas between the element-wise patterned stamp 14 and the wafer may be intermittently sprayed by using the gas spray nozzle (not shown) to make the separation more effectively.

Next, the resist droplet is applied again to the separated surface of the nanostructures 14'a of the element-wise patterned stamp 14, and the substrate chuck 20 is moved to perform the second process. Here, the substrate chuck 20 is moved along the guide block 22. The stamp chuck 16 and the pressure supply unit 30 remain fixed when the substrate chuck 20 is moved. In addition, after the substrate chuck 20 is moved, the resist may be formed in a predetermined region of the wafer by repeating the afore-mentioned process. For example, when the nanostructures are formed in an 8 inch wafer by using the 5×5 inch element-wise patterned stamp, the resist may be formed by repeating the afore-mentioned process four times. Next, the upper surface of the wafer having the deposited resist 36 is etched. When the resist left in the upper surface of the wafer is removed, the nanostructures are formed on the wafer.

Further, when the stamp board rather than the wafer is used for the substrate, the large-area element-wise patterned stamp can be fabricated at low cost by performing the afore-mentioned process.

Figure 6:
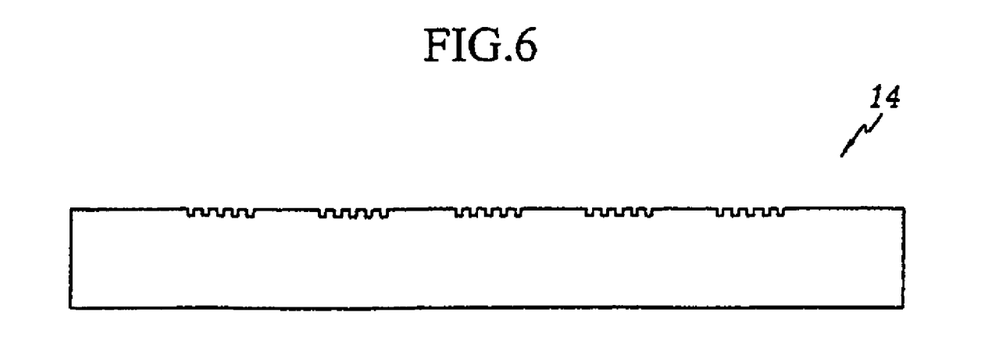
FIG. 6 is a cross sectional view of a planar stamp according to another embodiment of the present invention

While the nanostructures fabricated by using the element-wise patterned stamp in the step and repeat method has been described above, the apparatus and process of the present invention can also be achieved by using a planar-type stamp 14' that does not include the channels 14b of FIG. 4, as shown in FIG. 6. However, in this case, to remove defects such as air entrapment, the apparatus according to the embodiment of the present invention should be arranged inside the vacuum chamber and performed under the vacuum ambient.

In addition, when the large-area stamp (planar-type stamp or element-wise patterned stamp) having the same working area with the wafer is fabricated by the stamp board as the substrate 28, the process can be completed at one time by using the afore-mentioned large-area stamp.

While the present invention has been particularly shown and described with reference to exemplary embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. An ultraviolet (UV) nanoimprint lithography apparatus for forming nanostructures on a substrate, comprising:
    a substrate chuck for fixating the substrate;
    a stamp made of a transparent material transmitting UV light and having at least two element stamps, a nanostructure being formed on the top surface of each element stamp;
    a stamp chuck for fixating the stamp;
    a UV lamp unit for providing UV light through the stamp to cure resist applied between the element stamps and the substrate;
    a moving unit for moving the substrate chuck or the stamp chuck to press the resist between the element stamps and the substrate; and
    a pressure supply unit for applying pressurized gas to a plurality of selected regions of the substrate facing the element stamps to fill the resist into the nanostructures of the element stamps, the pressure supply unit being provided separable from the substrate chuck,
    wherein the pressure supply unit comprises:
        a closure type of housing having a hollow cavity;
        a plurality of gas supply holes provided in the housing and connected to the hollow cavity; and
        a gas supplier for supplying gas to the hollow cavity,
    wherein the substrate chuck is configured to have a plurality of through holes connectable to the plurality of gas supply holes,
    wherein the housing is provided separable from the substrate chuck and is configured to move under the substrate chuck.

2. The UV nanoimprint lithography apparatus of claim 1, wherein the substrate chuck is configured to move in a horizontal direction along a guide block and to move in a vertical direction along the moving unit.

3. The UV nanoimprint lithography apparatus of claim 2, wherein the substrate chuck is guided by a plurality of guide rods while moving in a vertical direction by the moving unit.

4. The UV nanoimprint lithography apparatus of claim 1, wherein the moving unit includes a hydraulic cylinder or a motor-driven actuator configured to move the pressure supply unit in a vertical direction.

5. The UV nanoimprint lithography apparatus of claim 1, wherein a sealing member is mounted on an upper surface of the housing to prevent leakage of gas supplied to the through holes via the plurality of gas supply holes.

6. The UV nanoimprint lithography apparatus of claim 1, further comprising a gas supply nozzle for spraying gas between the stamp and the substrate to separate the stamp from the substrate.

7. The UV nanoimprint lithography apparatus of claim 1, wherein the stamp is a planar-type stamp having a flat surface on which the nanostructures are imprinted.

8. The UV nanoimprint lithography apparatus of claim 1, wherein the stamp is an element-wise patterned stamp comprising:
    at least two element stamps having the nanostructures imprinted on a surface of each element stamp; and
    a plurality of channels being deeper than the nanostructures between adjacent element stamps.

9. The UV nanoimprint lithography apparatus of claim 8, wherein, a channel of the plurality of channels in the element-wise patterned stamp is in a range from 2 times to 1000 times deeper than a height the nanostructure formed on the surface of each element stamp.

* * * * *